United States Patent [19]
Tsai et al.

[11] Patent Number: 6,156,640
[45] Date of Patent: Dec. 5, 2000

[54] DAMASCENE PROCESS WITH ANTI-REFLECTION COATING

[75] Inventors: Meng-Jin Tsai, Hsinchu; Yimin Huang, Taichung Shien, both of Taiwan

[73] Assignee: United Microelectronics Corp., Hsinchu, Taiwan

[21] Appl. No.: 09/115,184

[22] Filed: Jul. 14, 1998

[51] Int. Cl.$^7$ ................................................. H01L 21/027
[52] U.S. Cl. ................. 438/636; 438/618; 438/620; 438/622; 438/629
[58] Field of Search ..................................... 438/618, 620, 438/629, 636, 622

[56] References Cited

U.S. PATENT DOCUMENTS 5,990,002  11/1999  Niroomand et al. ..................... 438/636
6,001,730  12/1999  Farkas et al. ........................... 438/627

*Primary Examiner*—Charles Bowers
*Assistant Examiner*—Lisa Kilday

[57] ABSTRACT

A method for improving the damascene process window for metallization utilizes an anti-reflective coating to increase the precision of the photolithography process. An inter-layer dielectric and an anti-reflective layer are formed in turn on a semiconductor substrate. The inter-layer dielectric is patterned to form the interconnecting line regions. A conductive layer is then deposited on the semiconductor substrate and fills the interconnecting line regions. The chemical mechanical polish is performed to remove a portion of the conductive layer exceeding the interconnect line regions and simultaneously remove residual portion of said anti-reflective layer.

20 Claims, 5 Drawing Sheets

DAMASCENE PROCESS WITH ANTI-REFLECTION COATING

BACKGROUND OF THE INVENTION

1. Field of the Invention

The present invention relates to a metallization process for fabrication of interconnect, and especially to a damascene process using anti-reflective coating to improve its process window.

2. Description of the Prior Art

For building an integrated circuit operating with desired action, it is necessary to fabricate many active devices on a single semiconductor substrate. Various kinds of devices with different functions, such as transistors, resistors and capacitors, are formed together. Today, we usually build hundreds of thousands of semiconductor devices on a single chip. Each of the devices on the substrate must be electrically isolated from the others to ensure their individual function, and, specific devices must be electrically interconnected so as to implement the whole desired circuit function.

In order to construct the interconnection and contact among all the active devices, a metallization process is employed. At an early stage, single layer metallization process provides all the designed connection. But, as the integrated circuit technology trend toward increase of the integration and decrease of the size, the surface of the chip cannot provide enough area to build all the interconnects needed. It must be designed more than one level of interconnects. The multilevel-interconnect technology is thus developed to meet this demand.

A conventional multilevel-interconnect technology is performed by utilizing a metal patterning to form the interconnecting lines. On the semiconductor substrate with active devices and underlying interconnect layer built in, the metal plug pattern is formed by dielectric layer deposition, photolithography and etching for patterning. After stripping the photoresist for plug pattern, a metal layer with metal plug is deposited on the semiconductor substrate. A metal line photolithography followed by an anisotropic etching is then performed to etch the metal layer to formed the interconnect layer.

Due to the difficulty of metal patterning, a new technique named damascene process is developed to be the tendency of the multilevel-interconnect technology. The damascene process employs the inter-layer dielectric patterning instead of the metal patterning. That is, after the plug process is done, another inter-layer dielectric is deposited, and the metal line pattern is opened in the inter-layer dielectric. The interconnection metal deposition with etching back then follows to refilled the metal line trenches. One level of interconnects is thus formed and the difficulty of metal patterning can be avoided.

Another improved method called dual damascene process is applied for simplify the manufacture processes. For the dual damascene process, the plug material is deposited at the same step of the interconnection metal line deposition. It means that the plug and interconnection line pattern are formed together after one single inter-layer dielectric deposition. And, of course, it reduces one times of inter-layer dielectric deposition, metal deposition and planarization respectively in comparison with single damascene process where the plug is formed individually.

The damascene and dual damascene processes fabricate the interconnect pattern using the dielectrics etching instead of the metal etching so as to avoid the difficulty of the latter one. But the damascene and dual damascene processes have their own problems. The interconnecting line width varies at the places where the upper lines cross over the underlying conductive lines. It's because the photoresist line pattern on transparent dielectric layer is easily influenced by standing wave effects and the under layer scattering due to diffraction and reflection. As referring to a cross-sectional view of a semiconductor wafer shown in FIG. 1, wherein a underlying conductive line 2 and a inter-layer dielectric 4 are built, a photoresist 6 is coated on the inter-layer dielectric 4 and exposed for a interconnect line pattern with a photo mask 8. The photo mask 8 has a width w the same as the desired photoresist line width, and therefore as the designed dielectric one between two adjacent interconnecting lines in the same level. In the exposure process, the exposure light 10 scattered from the underlying conductive line 2 to the photoresist 6 will increase the exposed photoresist region and cause the photoresist line width decreasing from value w to value x after development. This phenomena causes notches of photoresist lines over topography and an interconnecting line width variation from value y to value z, which will result in a metal bridge problem.

The metal bridge problem is severe when the dielectric line width is narrow in design rule, especially when below deep submicron range. FIG. 2 shows a top view of a semiconductor wafer, wherein the AA' cross section is illustrated in FIG. 1. The regions 20 represent the underlying conductive lines marked 6 previously in FIG. 1. The patterned photoresist lines 2, which are marked 6 in FIG. 2 and in FIG. 1, become narrow right over the underlying conductive lines 2 from a designed line width of value w to the final value x. Then the line width of the interconnecting lines represented by regions 24 varies from a desired value y to a larger value z. The notches 26 of photoresist lines, which will result in dielectric notches finally, may be so narrow that the dielectric lines break and the insulated metal lines come into contact with each other. Even if the dielectric lines do not break, it may be still too narrow that the tunneling effect will arise, and thus the metal bridges could be generated here whenever the dielectric lines break or not.

SUMMARY OF THE INVENTION

A method for improving the damascene process window for metallization is disclosed. This method utilizes an anti-reflective coating to suppress scattering from underlying conductive layer and the standing wave effects.

For the first embodiment of single damascene process, a dielectric layer is deposited on the substrate and the plugs is formed in this dielectric layer. The inter-layer dielectric and the ARC layer are then formed in turn and patterned with the interconnecting line regions. After removing the photoresist, The conductive layer is formed on the substrate and fills the interconnecting line regions. The chemical mechanical polishing is performed to finish the present process by removing the portion of the conductive layer exceeding the interconnecting line regions and providing the global planarization to the substrate.

For the second embodiment of dual damascene process, the inter-layer dielectric and the ARC layer are deposited in turn on the substrate, and the interconnecting line regions and the plug regions are successively patterned in the inter-layer dielectric. The conductive layer is formed on the substrate and fills the interconnecting line regions and the plug regions. The chemical mechanical polishing is then performed to remove the portion of the conductive layer exceeding the interconnecting line regions and provide the global planarization to the substrate. The dual damascene process is thus finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method to improve damascene process window for multilevel-interconnect technology. The method described here includes many processes steps well known in the art like photolithography, etching or chemical vapor deposition (CVD) which are not discussed in detail. In addition, the present invention utilizes an anti-reflective coating to increase the precision of the photolithography process.

Figure 1:
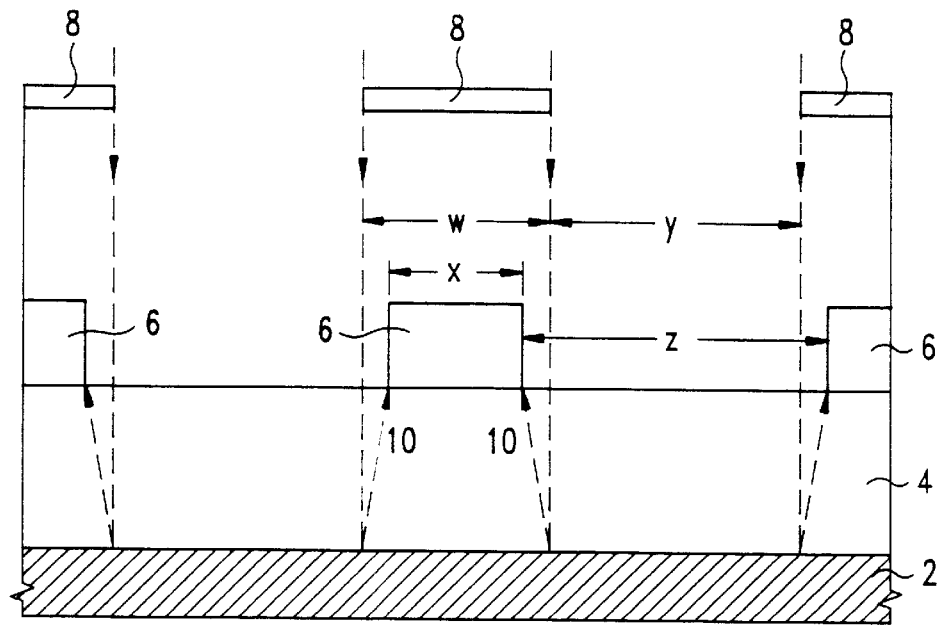
FIG. 1 is a cross-sectional view of a semiconductor wafer illustrating the phenomena of a photoresist line width variation caused by the under layer light scattering according to prior art.
Figure 2:
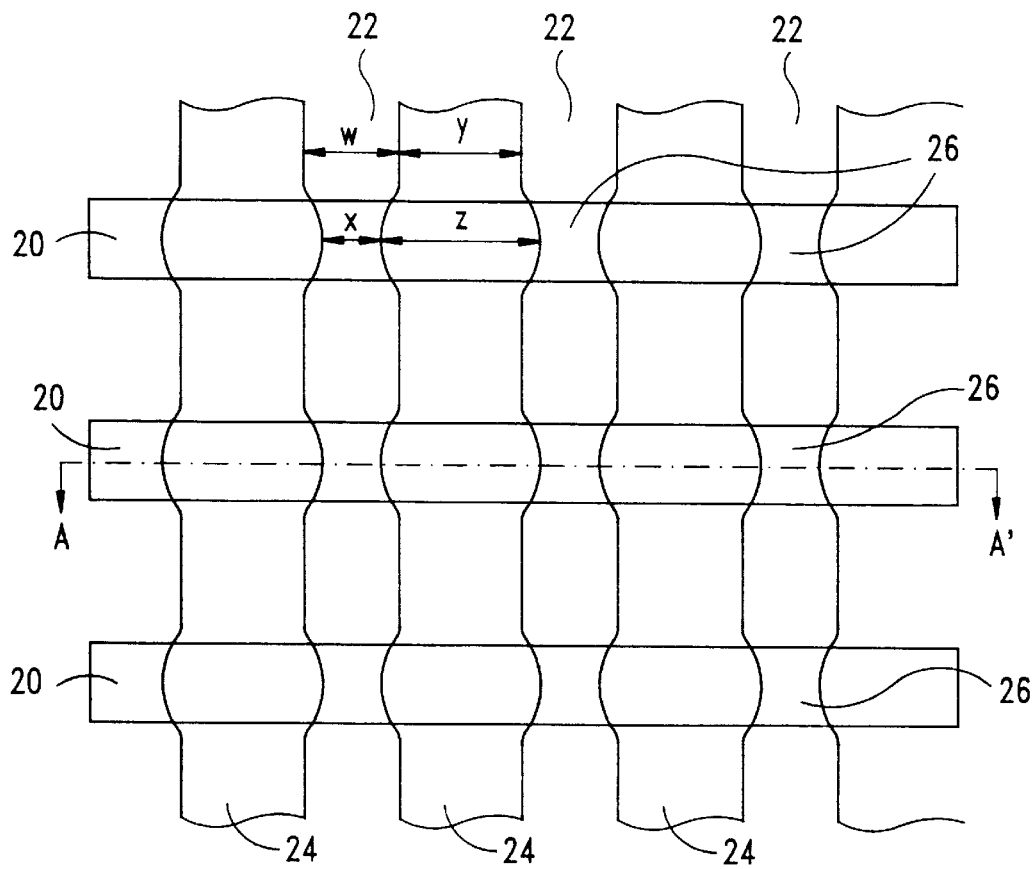
FIG. 2 is a top view of a semiconductor wafer illustrating the s phenomena of photoresist and interconnecting line width variations caused by the under layer light scattering according to prior art.
Figure 3:
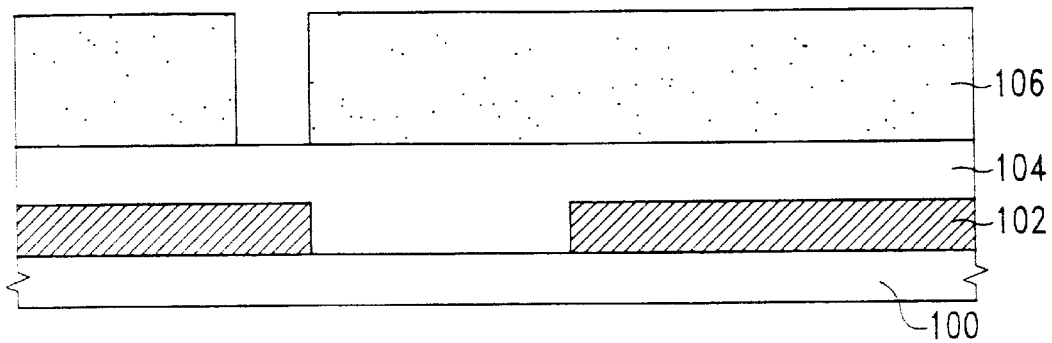
FIG. 3 is a cross-sectional view of a semiconductor wafer illustrating the steps of forming a dielectric layer and a photoresist with plug pattern on the substrate according to the first embodiment of the present invention.

The first embodiment for single damascene process of the present invention is described as follows. Referring to FIG. 3, a semiconductor substrate 100, wherein all the designed active devices are built, is provided. The conductive layer 102 represents electrodes of those designed active devices or an underlying interconnect layer. Those active devices, such as transistors, resistors and capacitors, are not shown in the following figures for the cross-sectional view of the semiconductor substrate. Without limiting the spirit and the scope of the present invention, only the metallization processes and the interconnect line profile are illustrated.

Over the conductive layer 102, a planarized inter-layer dielectric 104 is deposited to provide the isolation between interconnect layer and active devices or between different interconnect layers. The inter-layer dielectric 104 is formed of the dielectric materials such as silicon nitride or silicon oxide including phospho silicate glass (PSG), boro silicate glass (BSG), boro-phospho silicate glass (BPSG), tetra-ethyl-ortho-silicate oxide (TEOS-oxide), and so on. The suitable method to form this dielectric layer 104 can be low-pressure chemical vapor deposition (LPCVD) or plasma-enhanced chemical vapor deposition (PECVD). The photoresist 106 with the pattern of the plug, either the contact plug or the via plug, is now formed on the inter-layer dielectric 104 by using a standard method of photolithography, comprising photoresist coating, exposure and development process.

Figure 4:
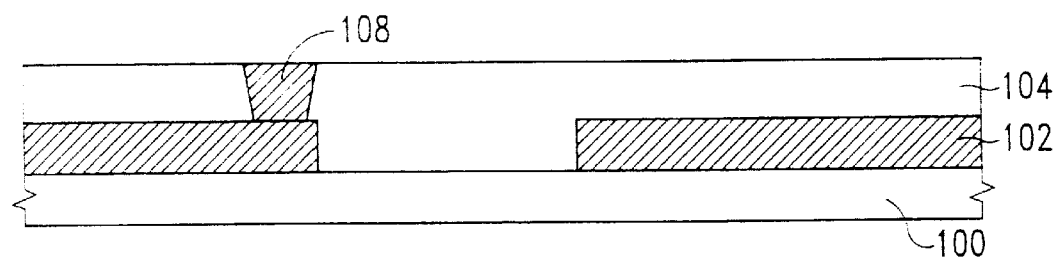
FIG. 4 is a cross-sectional view of a semiconductor wafer illustrating the step of etching and refilling the plug regions according to the first embodiment of the present invention.

Turning next to FIG. 4, an anisotropic etching process is carried out to form the plug regions in the inter-layer dielectric 104. A dry etching such as reactive ion etching (RIE) process is proper for this anisotropic etching. And the plasma source containing oxygen and fluorocarbon such as $CF_4$, $CHF_3$, $C_2F_6$ or $C_3F_8$ will be preferable etching gases for both oxide and nitride dielectric. Then, after the photoresist 106 is removed and wet cleaned, the metal plug 108 is formed by using chemical vapor deposition (CVD) with etching back. In general, the metal plug 108 is formed of tungsten with glue layer of titanium nitride (TiN) or titanium-tungsten (TiW). And a chemical mechanical polish (CMP) can optionally be employed for etching back process and for global planarization simultaneously.

Figure 5:
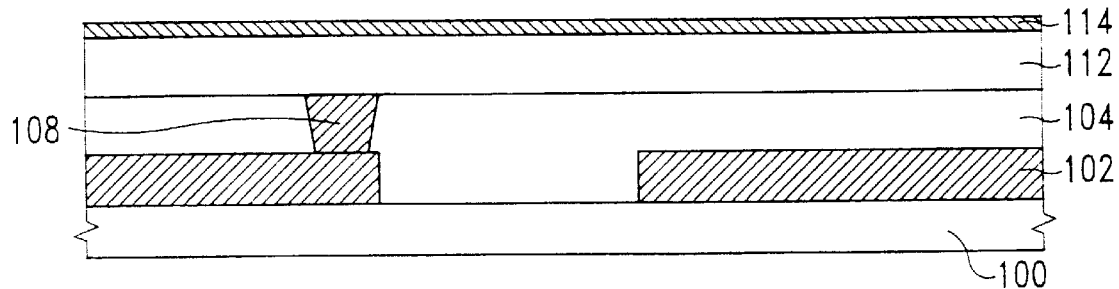
FIG. 5 is a cross-sectional view of a semiconductor wafer illustrating the steps of forming a inter-layer dielectric and a ARC layer on the substrate according to the first embodiment of the present invention.

Next, another dielectric layer 112 for isolation between different conductive lines in the same level is deposited on the semiconductor substrate 100 as shown in FIG. 5. An anti-reflective coating (ARC) layer 114 is then formed on the surface of the dielectric layer 112. The material of the ARC layer 114 is selected depending on the wavelength of the light source using at the later exposure step for the damascene patterning. Due to the different wavelength scopes of the absorption lines, a double film of titanium and titanium nitride (Ti/TiN) is a preferable ARC material for I-line source, and silicon oxynitride (SiON) is preferable for deep ultra-violet (DUV) ray. The double film of titanium and titanium nitride (Ti/TiN) can be formed by magnetron DC sputtering for titanium deposition followed by a rapid thermal process (RTP) in a nitrogen containing ambient for nitridation. Alternatively, it can be formed by titanium deposition followed by a reactive sputtering for titanium nitride deposition. The silicon oxynitride (SiON) can be formed by PECVD or LPCVD at a temperature of about 300° C. to 800° C. It can also be formed by heating the silicon oxide in a NO or $N_2O$ ambient. With this ARC layer 114, the precision of the later exposure will be increase, and the interconnecting line pattern will formed more accurately.

Figure 6:
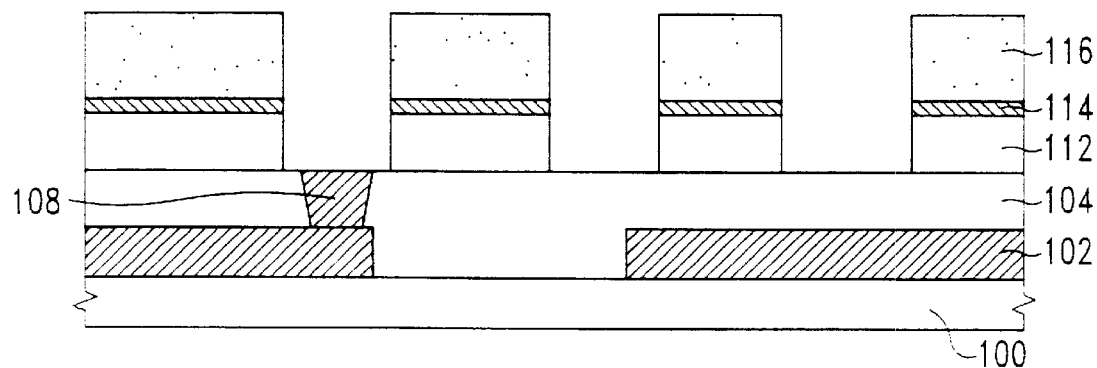
FIG. 6 is a cross-sectional view of a semiconductor wafer illustrating the steps of patterning the inter-layer dielectric according to the first embodiment of the present invention.

Referring to FIG. 6, the photoresist 116 is now patterned on the ARC layer 114 with the pattern of the interconnecting conductive lines by a standard photolithography process. During the exposure process of the photolithography, the ARC layer 114 absorbs most of the radiation that penetrates the photoresist 116. Standing wave effects are substantially reduced, as there is much less reflection off of the underlying metal lines or electrodes. Scattering from topographical feature is also suppressed. In addition, The ARC layer 114 may partially planarize the topography of the substrate. All of these help to reduce photoresist linewidth variation over steps.

A dry etching now follows to anisotropically etch the ARC layer 114 and dielectric layer 112, and the interconnecting conductive line regions is consequently opened in the dielectric layer 112. By the using of ARC layer 114, the linewidth variations could be minimized, and the metal bridge problem is alleviated.

Figure 7:
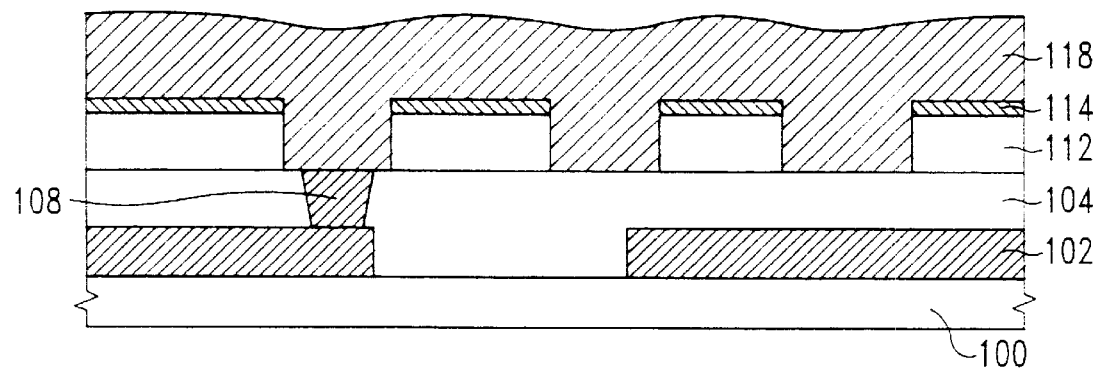
FIG. 7 is a cross-sectional view of a semiconductor wafer illustrating the steps of forming the conductive layer according to the first embodiment of the present invention.
Figure 8:
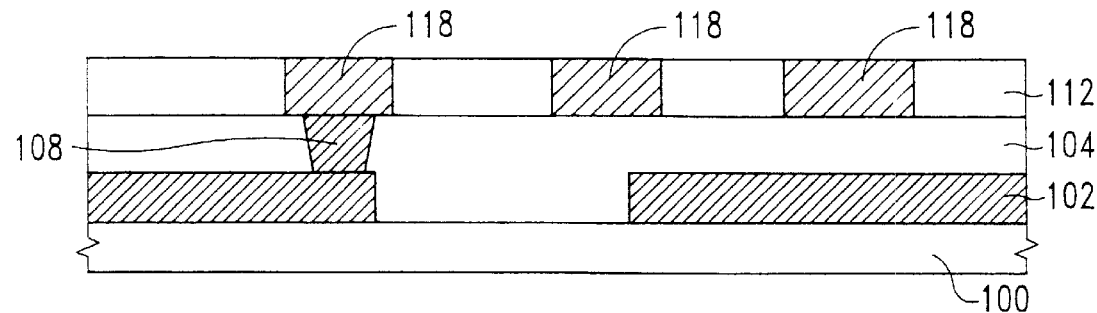
FIG. 8 is a cross-sectional view of a semiconductor wafer illustrating the steps of performing a chemical mechanical polishing according to the first embodiment of the present invention.

Next, as can be seen by referring to FIG. 7, the conductive layer 118 is deposited over the semiconductor substrate 100 and fills the interconnecting conductive line regions. This conductive layer 118 can be formed of the conductive materials such as Al, Cu, and so on. The physical vapor deposition (PVD) technique like sputtering will be preferable for this conductive line deposition. Finally, referring to FIG. 8, a chemical mechanical polish (CMP) process is then carried out to remove a portion of the conductive layer 118 which excesses the interconnecting conductive line regions. The residual ARC layer 114 can be stripped at this same step without any extra procedures, and, the global planarization can be achieved simultaneously. One level of the interconnects with the plug to underlying conductive layer is thus formed with a better topography than traditional one.

Figure 9:
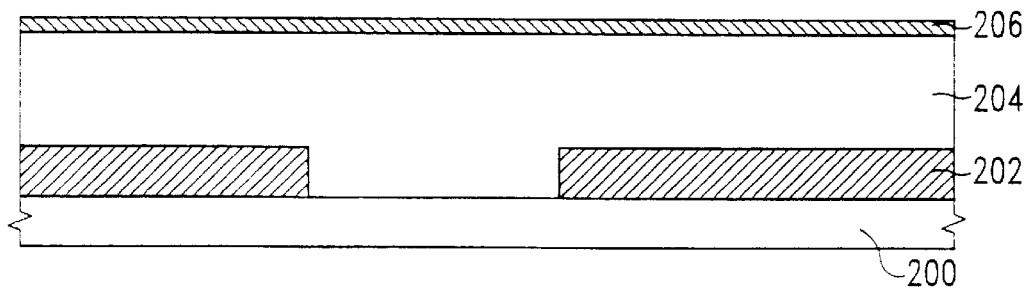
FIG. 9 is a cross-sectional view of a semiconductor wafer illustrating the steps of forming a inter-layer dielectric and a ARC layer on the substrate according to the second embodiment of the present invention.

Another embodiment for dual damascene process of the present invention is next described as follows. Similarly to the first embodiment for single damascene process, a semiconductor substrate 200 with all the designed active is provided as referring to FIG. 9. The conductive layer 202 represents electrodes of those designed active devices or an underlying interconnect layer. With the same principle holding for the first embodiment, those designed active devices are not shown in the following cross-sectional figures of the semiconductor substrate. And without limiting the spirit and the scope of the present invention, only the metallization processes and the interconnect line profile are illustrated.

A planarized inter-layer dielectric 204 is deposited over the conductive layer 202 with a thickness thick enough for forming both plug and interconnecting layer within. This inter-layer dielectric 204 provided isolation between interconnect layer and active devices or between different interconnect layers, and is formed of the dielectric materials such as silicon nitride or silicon oxide including phospho silicate glass (PSG), boro silicate glass (BSG), boro-phospho silicate glass (BPSG), tetra-ethyl-ortho-silicate oxide (TEOS-oxide), and so on. The suitable method to form this dielectric layer 104 can be low-pressure chemical vapor deposition (LPCVD) or plasma-enhanced chemical vapor deposition (PECVD).

An anti-reflective coating (ARC) layer 206 is then formed on the surface of the inter-layer dielectric 204. Dependent on the wavelength of the light source using at the later exposure step for the damascene patterning, the preferable material of the ARC layer 206 is a double film of titanium and titanium nitride (Ti/TiN) for I-line source, and silicon oxynitride (SiON) for deep ultra-violet (DUV) ray. The double film of Ti/TiN can be formed by a titanium sputtering followed by a nitridation or formed by titanium deposition followed by a titanium nitride sputtering. The silicon oxynitride (SiON) can be formed by PECVD, LPCVD or by heating the silicon oxide in a NO or $N_2O$ ambient. By the use of the ARC layer 206, the later exposure will be carried out with a excellent precision, and the interconnecting line pattern will formed more accurately.

Figure 10:
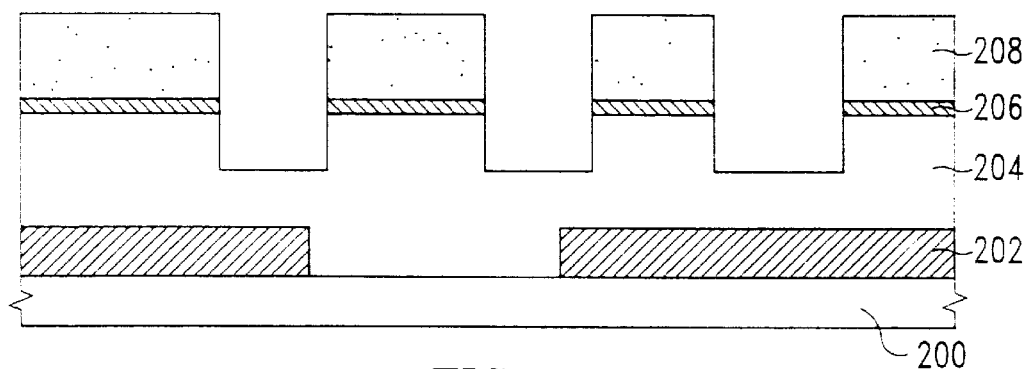
FIG. 10 is a cross-sectional view of a semiconductor wafer illustrating the steps of patterning the inter-layer dielectric with interconnect line regions according to the second embodiment of the present invention.

Referring to FIG. 10, the photoresist 208 with the pattern of the interconnecting metal lines is now formed on the ARC layer 206 by a standard photolithography process. Most of the radiation that penetrates the photoresist 208 during the exposure is absorbed by the ARC layer 206. Standing wave effects and scattering from topographical feature are substantially reduced. The photoresist linewidth variation over steps is reduced.

A dry etching then follows to anisotropically etch the ARC layer 206 and dielectric layer 204, and the interconnecting conductive line regions is consequently opened in the dielectric layer 204 with a depth less than that of the dielectric layer 204. With the help by the ARC layer 206, the line width variations could be minimized, and the metal bridge problem is alleviated.

Figure 11:
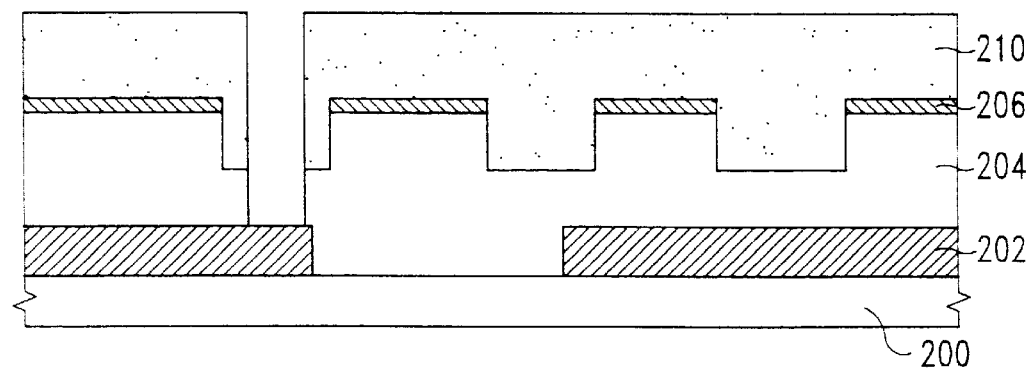
FIG. 11 is a cross-sectional view of a semiconductor wafer illustrating the steps of patterning the inter-layer dielectric with plug regions according to the second embodiment of the present invention.

Turning next to FIG. 11, the photoresist 208 is removed, and the photoresist 210 with the pattern of the plug is now formed on the inter-layer dielectric 204. Then an anisotropic etching process such as reactive ion etching (RIE) follows to form the plug regions in the inter-layer dielectric 204.

Figure 12:
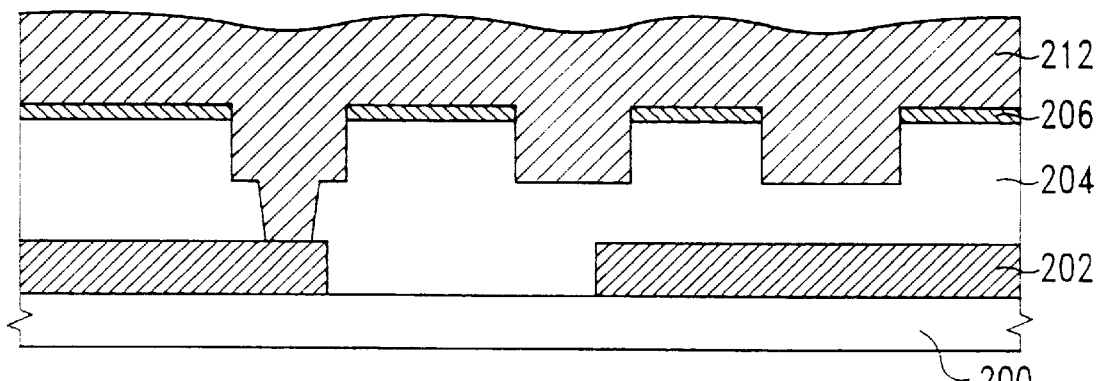
FIG. 12 is a cross-sectional view of a semiconductor wafer illustrating the steps of forming the conductive layer according to the second embodiment of the present invention.
Figure 13:
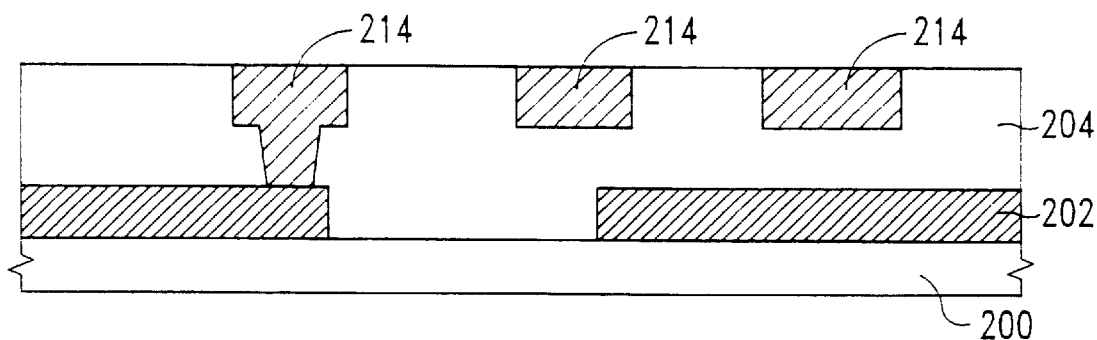
FIG. 13 is a cross-sectional view of a semiconductor wafer illustrating the steps of performing a chemical mechanical polishing according to the second embodiment of the present invention.

Next, as can be seen by referring to FIG. 12, after the photoresist 210 is removed and wet cleaned, the conductive layer 212 is deposited over the semiconductor substrate 200 and fills both of the interconnecting metal line regions and the plug regions. This conductive layer can be formed of the conductive materials including Al, Cu, and so on. Finally, referring to FIG. 13, a chemical mechanical polish (CMP) process is then carried out to remove a portion of the conductive layer 212 which excess the interconnecting conductive line regions and simultaneously provide the global planarization. The residual ARC layer 206 can be stripped at this same step without any extra procedures. By the ARC layer, the present dual damascene process thus finish the fabrication of one interconnect level and the plug to underlying conductive layer with a better topography than traditional one.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for improving a damascene process window for metallization, said method comprises:

forming a dielectric layer on a semiconductor substrate;

forming an anti-reflective layer on said dielectric layer;

patterning said dielectric layer, thereby forming interconnect line regions in said dielectric layer; and forming a conductive layer in said interconnect line regions.

2. The method according to claim 1, further comprising the following steps to form plugs before said dielectric layer is formed:

forming an inter-layer dielectric on said semiconductor substrate;

patterning said inter-layer dielectric to form plug regions in said inter-layer dielectric; and filling said plug regions with conductive material.

3. The method according to claim 2, further comprising a chemical mechanical polishing to planarize said semiconductor substrate after said plug regions is filled.

4. The method according to claim 1, wherein said anti-reflective layer is formed of a material selected from the group consisting of a double film of titanium and titanium nitride (Ti/TiN) and silicon oxynitride (SiON).

5. The method according to claim 1, wherein said interconnect line regions is patterned in said dielectric layer by a photolithography process using I-line as the exposure light source with the anti-reflective layer being formed of double film of titanium and titanium nitride (Ti/TiN).

6. The method according to claim 1, wherein said interconnect line regions are patterned in said dielectric layer by a photolithography process using deep ultra-violet (DUV) as the exposure light source with the anti-reflective layer being formed of silicon oxynitride (SiON).

7. The method according to claim 1, further comprising a step for patterning plug regions in said dielectric layer after said interconnect line regions is formed.

8. The method according to claim 2, further comprising a step for removing a portion of said conductive layer which exceeds said interconnect line regions and simultaneously removing a residual portion of said anti-reflective layer.

9. The method according to claim 8, wherein said exceeding portion of said conductive layer and said residual portion of said anti-reflective layer are removed by a chemical mechanical polishing process.

10. A method for improving the damascene process window for metallization, said method comprising the steps of:

forming an inter-layer dielectric on said semiconductor substrate;

patterning said inter-layer dielectric to form the plug regions in said inter-layer dielectric; and filling said plug regions with conductive material;

forming a dielectric layer on a semiconductor substrate;

forming an anti-reflective layer on said dielectric layer;

patterning said dielectric layer, thereby forming the interconnect line regions in said dielectric layer;

depositing a conductive layer on said semiconductor substrate, thereby filling said interconnect line regions; and removing a portion of said conductive layer which exceed said interconnect line regions and simultaneously removing a residual portion of said anti-reflective layer.

11. The method according to claim 10, further comprising a chemical mechanical polishing to planarize said semiconductor substrate after said plug regions is filled.

12. The method according to claim 10, wherein the anti-reflective layer is formed of a material selected from the group consisting of a double film of titanium and titanium nitride (Ti/TiN) and silicon oxynitride (SiON).

13. The method according to claim 10, wherein said interconnect line regions are patterned in said dielectric layer by a photolithography process using I-line as the exposure light source with the anti-reflective layer being formed of double film of titanium and titanium nitride (Ti/TiN).

14. The method according to claim 10, wherein said interconnect line regions is patterned in said dielectric layer by a photolithography process using deep ultra-violet (DUV) as the exposure light source with the anti-reflective layer being formed of silicon oxynitride (SiON).

15. The method according to claim 10, wherein said exceeding portion of said conductive layer and said residual portion of said anti-reflective layer are removed by a chemical mechanical polishing process.

16. A method for improving a damascene process window for metallization, said method comprises:

forming a inter-layer dielectric on a semiconductor substrate;

forming an anti-reflective layer on said inter-layer dielectric;

patterning said inter-layer dielectric, thereby forming the interconnect line regions in said inter-layer dielectric;

patterning said inter-layer dielectric, thereby forming the plug regions in said inter-layer dielectric depositing a conductive layer on said semiconductor substrate, thereby filling said interconnect line regions; and removing a portions of said conductive layer which exceed said interconnect line regions and simultaneously removing a residual portion of said anti-reflective layer.

17. The method according to claim 16, wherein the anti-reflective layer is formed of a material selected from the group consisting of a double film of titanium and titanium nitride (Ti/TiN) and silicon oxynitride (SiON).

18. The method according to claim 16, wherein said interconnect line regions is patterned in said inter-layer dielectric by a photolithography process using I-line as the exposure light source with the anti-reflective layer being formed of double film of titanium and titanium nitride (Ti/TiN).

19. The method according to claim 16, wherein said interconnect line regions is patterned in said inter-layer dielectric by a photolithography process using deep ultra-violet (DUV) as the exposure light source with the anti-reflective layer being formed of silicon oxynitride (SiON).

20. The method according to claim 16, wherein said exceeding portion of said conductive layer and said residual portion of said anti-reflective layer are removed by a chemical mechanical polishing process.

* * * * *